United States Patent
Goodnow et al.

(10) Patent No.: US 7,849,426 B2
(45) Date of Patent: *Dec. 7, 2010

(54) MECHANISM FOR DETECTION AND COMPENSATION OF NBTI INDUCED THRESHOLD DEGRADATION

(75) Inventors: Kenneth J. Goodnow, Essex Junction, VT (US); Douglas W. Kemerer, Essex Junction, VT (US); Stephen G. Shuma, Underhill, VT (US); Oscar C. Strohacker, Leander, TX (US); Mark S. Styduhar, Hinesburg, VT (US); Peter A. Twombly, Shelburne, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 577 days.

This patent is subject to a terminal disclaimer.

(21) Appl. No.: 11/931,144

(22) Filed: Oct. 31, 2007

(65) Prior Publication Data

US 2009/0113358 A1    Apr. 30, 2009

(51) Int. Cl.
G06F 17/50 (2006.01)
G01R 31/26 (2006.01)

(52) U.S. Cl. .................... 716/5; 716/4; 324/765

(58) Field of Classification Search ............. 716/4; 324/765

See application file for complete search history.

(56) References Cited

U.S. PATENT DOCUMENTS

| | | |
|---|---|---|
| 6,456,104 B1 | 9/2002 | Guarin et al. |
| 6,476,632 B1 | 11/2002 | La Rosa et al. |
| 6,521,469 B1 | 2/2003 | La Rosa et al. |
| 6,574,160 B1 | 6/2003 | Bleyan et al. |
| 6,731,179 B2 | 5/2004 | Abadeer et al. |
| 6,762,961 B2 | 7/2004 | Eleyan et al. |
| 6,812,758 B2 | 11/2004 | Gauthier et al. |
| 6,815,970 B2 | 11/2004 | Rost et al. |
| 6,933,869 B1 | 8/2005 | Starr et al. |
| 2004/0053429 A1 | 3/2004 | Muranaka |
| 2004/0073412 A1 | 4/2004 | Walker et al. |
| 2004/0155696 A1 | 8/2004 | Gauthier et al. |

*Primary Examiner*—Jack Chiang
*Assistant Examiner*—Patrick Sandoval
(74) *Attorney, Agent, or Firm*—Gibb I.P. Law Firm, LLC; Michael J. LeStrange, Esq

(57) ABSTRACT

The embodiments of the invention provide a design structure for detection and compensation of negative bias temperature instability (NBTI) induced threshold degradation. A semiconductor device is provided comprising at least one stress device having a voltage applied to its gate node and at least one reference device having a zero gate-to-source voltage. A controller is also provided to configure node voltages of the device and/or the reference device to reflect different regions of device operations found in digital and analog circuit applications. Moreover, the controller measures a difference in current between the stress device and the reference device to determine whether NBTI induced threshold degradation has occurred in the stress device. The controller also adjusts an output power supply voltage of the stress device until a performance of the stress device matches a performance of the reference device to account for the NBTI induced threshold degradation.

13 Claims, 7 Drawing Sheets

MECHANISM FOR DETECTION AND COMPENSATION OF NBTI INDUCED THRESHOLD DEGRADATION

CROSS-REFERENCE TO RELATED APPLICATIONS

This application is related to U.S. application Ser. No. 11/550,814 filed Oct. 19, 2006, the complete disclosure of which, in its entirety, is herein incorporated by reference.

BACKGROUND

1. Field of the Invention

The embodiments of the invention provide an apparatus and method for detection and compensation of negative bias temperature instability (NBTI) induced threshold degradation.

2. Description of the Related Art

Due to NBTI, the magnitude of the threshold voltage (Vt) of positive-channel metal-oxide semiconductor (PMOS) transistors increases over time which tends to decrease the current flowing through the transistor, for a particular set of bias conditions. A means of detecting the change in Vt and device current is needed. Once the degradation in these two parameters is known, the next step is to compensate for the degradation so that the device performance over the operating life of the product can be maintained.

Currently, there is no active approach (i.e., a circuit implementation) to counteract the effects of NBTI degradation. Today, a special set of reliability device models are used during circuit simulations to understand the effects of device degradation due to NBTI and Hot Carrier Injection (HCI). The result is to over-design the circuit so that it works both at the beginning of life (BOL) as well as at the end of life. This passive approach is challenging because it is difficult to end up with a robust design for all circuits, especially analog circuits, since the process window that must be met is typically larger, making it difficult to consistently design circuits that work over this larger process, voltage, and temperature window.

SUMMARY

The embodiments of the invention provide an apparatus and method for detection and compensation of NBTI induced threshold degradation. A semiconductor device is provided comprising at least one stress device 410, a voltage source connected to a gate node of stress device 410, and at least one reference device 420 having a zero gate-to-source voltage (Vgs). A controller 430 is connected to stress device 410 and reference device 420, wherein controller 430 configures node voltages of stress device 410 and/or reference device 420 to reflect different regions of device operation found in digital and analog circuit applications. Moreover, controller 430 measures a difference in current between stress device 410 and reference device 420 to determine whether NBTI induced threshold degradation has occurred in stress device 410. Controller 430 also adjusts an output power supply voltage of stress device 410 until a performance of stress device 410 matches a performance of reference device 420 to account for the NBTI induced threshold degradation.

Controller 430 stimulates stress device 410 and/or reference device 420 with gate node signals and drain node bias voltages. A simple resistor load and a replica load are further provided to facilitate the development of the drain node bias voltages. Additionally, an analog multiplexer is connected to a drain node of stress device 410, such that the simple resistor load and/or the replica load are at a drain node of stress device 410 and/or reference device 420.

Controller 430 generates an absolute current reference and/or an absolute voltage reference outside of an integrated circuit device that the semiconductor device is on. Controller 430 compares the absolute current reference and/or the absolute voltage reference to a current of stress device 410 to determine whether NBTI induced threshold degradation has occurred in stress device 410. Further, controller 430 forward biases a bulk node of stress device 410, resulting in decreasing the magnitude of the Vt to account for the NBTI induced threshold degradation.

A method for accommodating for effects of NBTI over a lifetime of a semiconductor device is provided. The method begins by configuring node voltages of at least one stress device 410 and/or at least one reference device 420 to reflect different regions of device operations found in digital and analog circuit applications, wherein stress device 410 comprises a voltage applied to its gate node, and wherein reference device 420 comprises a zero Vgs. This involves stimulating stress device 410 and/or reference device 420 with gate node signals and drain node bias voltages. The method develops the drain node bias voltages using a simple resistor load and/or a replica load. Further, the method connects an analog multiplexer to a drain node of stress device 410 such that the simple resistor load and/or the replica load is at a drain node of stress device 410 and/or reference device 420.

Following this, the method performs a calibration mode, a measure mode and an adjustment mode. The measure mode can measure a difference in current between stress device 410 and reference device 420 to determine whether NBTI induced threshold degradation has occurred in stress device 410. The measure mode also can generate an absolute current reference and/or an absolute voltage reference outside of an integrated circuit device that the semiconductor device is on and compare the absolute current reference and/or the absolute voltage reference to a current of stress device 410 to determine whether the NBTI induced threshold degradation has occurred in stress device 410.

The adjustment mode can adjust a power supply voltage applied to stress device 410 until a performance of stress device 410 matches a performance of reference device 420 to account for the NBTI induced threshold degradation. The adjustment mode also can forward bias a bulk node of stress device 410, including decreasing the magnitude of the Vt to account for the NBTI induced threshold degradation.

Accordingly, an aspect of the embodiments of the invention involves how to indirectly determine the effects of NBTI on Vt through direct monitoring of the difference in output current (Ids) of two identical PMOS transistors or two identical sets of PMOS transistors. Another aspect of the embodiments the invention is to have the system react to the NBTI induced Vt and Ids degradation by compensating for it through increasing the power supply voltage to the affected transistors.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
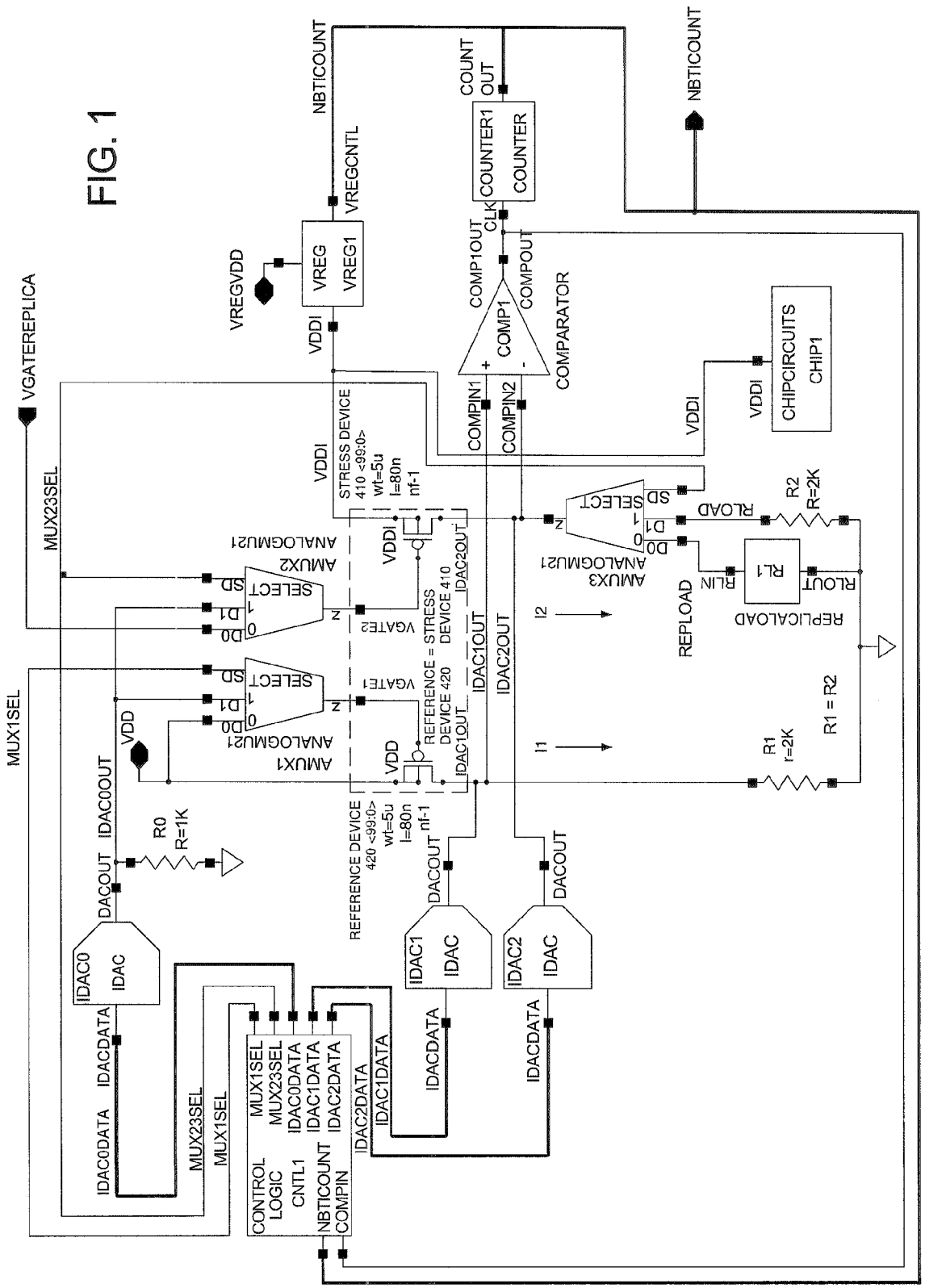
FIG. 1 is a diagram illustrating a system for determining and compensating for NBTI induced Vt degradation via monitoring of delta Ids.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Accordingly, an aspect of the invention involves how to indirectly determine the effects of NBTI on Vt through direct monitoring of the difference in Ids of two identical PMOS transistors or two identical sets of PMOS transistors. Another aspect of the embodiments the invention is to have the system react to the NBTI induced Vt and Ids degradation by compensating for it through increasing the power supply voltage to the affected transistors.

In an aspect of the invention, one transistor is considered reference device 420 which undergoes minimal, if any, NBTI induced threshold degradation. This is assured by the fact that the Vgs is zero for nearly all time. In addition, the drain-to-source voltage (Vds) of reference device 420 is allowed to be easily controlled and set to various values as well.

The embodiments herein provide the flexibility for stress device 410 (the other of the two identical transistors) to be stimulated with various gate node signals and drain node bias voltages. The gate node of stress device 410 can be stimulated with any signal found on the integrated circuit or brought from off-chip. An appropriate signal might be one that is contained within a 'critical or sensitive' on-chip circuit, or one that results in a large value of Vgs for a prolonged amount of time. The latter would maximize NBTI effects since this degradation increases with an increase in Vgs. During 'Stress Mode' an analog multiplexer allows the signal of interest to propagate to the gate node of stress device 410. The voltage seen at the drain node of stress device 410 is developed either via a simple resistor load, or via a 'replica' load which would be a replica of a specific circuit configuration found elsewhere on the chip. In either case, an analog multiplexer is connected to the drain node of stress device 410 so that either of these loads can be made present at the drain node.

Another feature of embodiments herein is to have the system react to the NBTI induced Vt and Ids degradation by compensating for it through increasing the power supply voltage to the affected transistors. This involves the use of a comparator, a counter, a voltage regulator, and a control logic/state machine block. An alternate embodiment to increasing the supply voltage would be to forward bias the bulk node of the affected transistors, thereby decreasing the magnitude of the Vt.

An alternative to an aspect of embodiments herein (i.e., measuring the difference in Ids between two PMOS transistors) would be to eliminate reference device 420 and use an absolute current (or voltage) reference generated externally and brought on-chip. This approach would allow Ids, and resulting voltage, from stress device 410 to be directly compared to an absolute current or voltage reference which could be calibrated external to the chip.

Three modes of operation for this circuit are a 'Calibration Mode', a 'Stress Mode' and a 'Measure Mode'. Stress Mode is involved in the normal operating mode of the chip, but more specifically it is to indicate that stress device 410 is being exercised or stressed. Referring to FIG. 1, reference device 420 and stress device 410 are identical. Reference device 420 is off most of the time.

Calibration mode accounts for the non-ideal behavior of the configuration setup and measurement/monitoring circuits used within this system. It accounts for the systematic and random effects inherent in the photolithography employed during mask build and wafer processing during manufacturing. Calibration mode accounts for the random mismatch shift in Vt, mobility (u), and oxide thickness (tox) of the two closely spaced PFET devices whose Ids is being compared. It also accounts for input offset voltages associated with the comparator and mismatch in the Ids values of the two identical current digital-to-analog converters (IDACs) with identical digital input values applied. Calibration mode provides a method to counteract the NBTI and HCI induced degradation of the support and measurement circuits themselves, thereby preserving the measurement capability and accuracy of the system over the product lifetime. During calibration mode, MUX1SEL and MUX23SEL are both at a logic one.

At the BOL of the chip during stress mode, the drain voltages of reference device 420 and stress device 410, (VDD and VDDI), respectively, are identical. The gate voltages of reference device 420 and stress device 410 (VGATE1 and VGATE2) come from the 2:1 analog multiplexers AMUX1 and AMUX2, respectively, where the D0-to-Z path is enabled for both since the multiplexer select signals, MUX1SEL and MUX23SEL, are both at a logic zero. In this state, the voltage at VGATE1 equals VDD, and the voltage at VGATE2 equals that of the VGATEREPLICA signal. For reference device 420, Vgs is zero in which case this transistor will undergo minimal to no NBTI degradation. For stress device 410, the VGATEREPLICA voltage applied to its gate can be routed from anywhere on the chip or be brought in from off-chip if necessary. The drain voltages of reference device 420 and stress device 410 (IDAC1OUT and IDAC2OUT), are developed from current flowing through resistor and replica circuit loads, respectively. The load at the drain of reference device 420 is a simple integrated circuit resistor (R1). The drain of stress device 410 is first connected to the output of a 2:1 analog multiplexer (AMUX3) having negligible on-resistance. The multiplexer allows for the load at the drain of stress device 410 to be configurable resulting in either a simple integrated circuit resistor load (R2) or a replica circuit load (RL1). In stress mode, the D0-to-Z path through AMUX3 is enabled since MUX23SEL is a logic zero, which in turn switches in the replica load for the drain of stress device 410. The replica load can vary in its implementation, from an exact copy, or replica, of a circuit found elsewhere on the chip to a R2.

Measure mode is used to determine the difference in the effects of NBTI degradation between reference device 420 and stress device 410. After this is known, the effects can be compensated for. The first time in measure mode, the DC bias voltages applied to the source and drain nodes of reference device 420 and stress device 410 as well as the load conditions at the source nodes are intended to be identical. The values of VDD and VDI applied at the source nodes of reference device 420 and stress device 410, respectively, will have the same value. The drain nodes of reference device 420 and stress device 410 (IDAC1OUT and IDAC2OUT) will experience the same loading since R1 and R2 are of equal value. The drain of reference device 420 will see RL1, and drain of stress device 410 will see R2 since MUX23SEL is a logic one which enables the D1-to-Z path through the 2:1 analog multiplexer AMUX3. Also connected to the IDAC1OUT and IDAC2OUT nodes are two identical current output DACs (IDACS), IDAC1 and IDAC2, respectively. Both DACs produce the same Ids value since the same digital input code is applied to both DACs. These current output DACs allow the voltage developed at the drain nodes of reference device 420 and stress device 410 to be adjusted, thus allowing reference device 420 and stress device 410 to be put in any desired region of operation. In measure mode, VGATE1 and VGATE2 are under the control of DAC IDAC0 and are developed via the IDAC0 Ids flowing through resistor R0. The voltage at node IDAC0OUT is propagated through the D1-to-Z path of multiplexers AMUX1 and AMUX2 when MUX1SEL and MUX23SEL are at logic one levels. The use of DAC IDAC0 and resistor R0 allows flexibility in setting VGATE1 and VGATE2, allowing these two devices to be placed in the chosen region of operation.

Also connected to the IDAC1OUT and IDAC2OUT nodes is a voltage comparator (COMP1) which compares two analog voltage levels applied at its COMPIN1 and COMPIN2 input pins and produces a digital signal, either logic zero or logic one, at its COMPOUT output pin. In this case, if COMPIN1 is greater than COMPIN2, then COMPOUT is a logic one. Alternatively, if COMPIN1 is less than or equal to COMPIN2, then COMPOUT is a logic zero.

Measure mode is the setup in which MUX23SEL is held at a constant logic one, but MUX1SEL gets toggled in a logic zero-one-zero pattern which constitutes one measure cycle. Several of these measure cycles can occur sequentially until the system responds and compensates for the NBTI degradation effects. When first entering measure mode, MUX1SEL is a logic zero which puts reference device 420 in cutoff since the gate and source are both at VDD (Vgs=0). There is no current flowing from the drain of reference device 420, and the only current flowing through load R1 is what is being provided from IDAC1. Also when first in measure mode, Vgs for stress device 410 will be some value greater than zero when the VGATE2 node is the same value as IDAC0OUT since MUX23SEL is a logic one enabling the D1-to-Z path of AMUX2. So the voltage at node IDAC2OUT across R2 results from current coming out of stress device 410 as well as current coming out of IDAC2. Under these conditions, the voltage at IDAC2OUT is greater than the voltage at IDAC1OUT, and the COMP1 output is a logic zero. Next, the MUX1SEL signal is set to a logic one, and as a result Vgs for reference device 420 and Vgs for stress device 410 are identical. However, if stress device 410 has undergone NBTI degradation, Ids for reference device 420 will be greater than Ids for stress device 410 in which case the voltage at IDAC1OUT will be greater than at IDAC2OUT. This in turn will cause the comparator COMP1 output to transition from a logic zero to a logic one. Next, the MUX23SEL signal is brought back to a logic zero which results in IDAC1OUT again becoming less than IDAC2OUT and causes the COMP1 output to transition from a logic one back to a logic zero. The above sequence completes one measure cycle, and the scenario described resulted in a positive pulse at the COMP1 output. When a positive pulse does result, this is an indication that stress device 410 as well as other PMOS transistors on the chip have undergone NBTI degradation and compensation needs to occur. If a positive pulse does not occur at the output of COMP1 from executing one measure cycle, it indicates stress device 410 has not undergone NBTI degradation and no compensation needs to occur.

Figure 2:
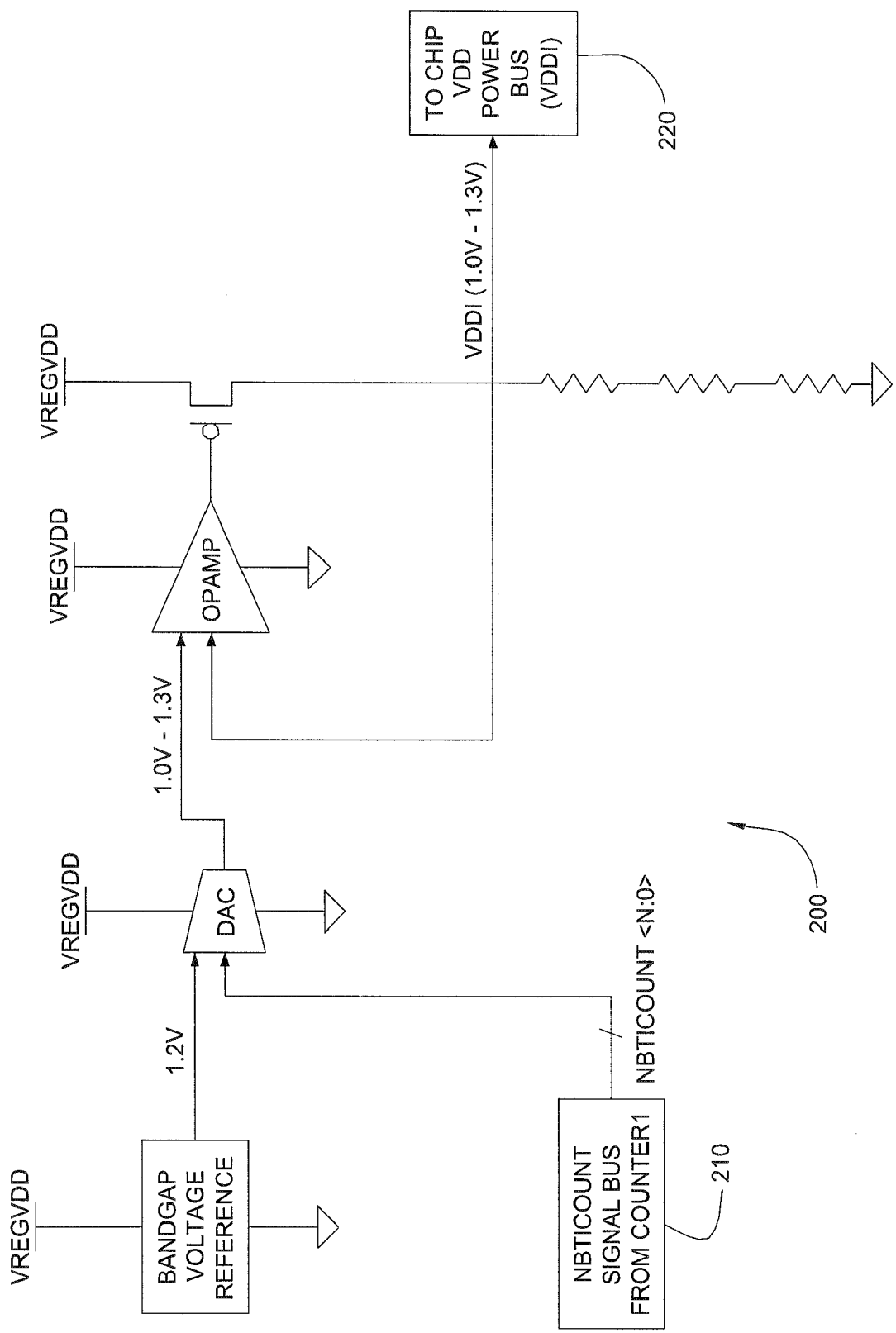
FIG. 2 is a diagram illustrating a voltage reference/regulator system.

The positive pulse at the COMP1 output is fed to the clock input (CLK) of an up counter (COUNTER1). For each pulse at the CLK input, the digital value at the counter output pins (COUNTOUT) and on the NBTICOUNT signal bus will be incremented. The COMP1 output is also fed to the control logic/state machine block (CNTL1). COUNTER1 can be integrated within the CNTL1 control logic block. When CNTL1 detects a positive pulse at its COMPIN pin, it will wait a programmed amount of time before executing another measure cycle to allow time for the NBTI compensation circuitry to react. An NBTICOUNT bus 210 is sent to an on-chip integrated voltage reference/regulator system (VREG1) 200 as shown in FIG. 2. As the digital count value on NBTICOUNT bus 210 increases, VREG1 200 responds by increasing the value of the analog voltage at a VDDI node 220.

This VDDI voltage is the power supply voltage for conceivably the rest of the circuits on the chip and is propagated to them as well as to the source node of stress device 410. If stress device 410 has undergone degradation, the increased VDDI value at its source node will act to compensate for the adverse effects. After a set amount of time, another measure cycle will be executed and either a positive pulse will occur at the output of COMP1 or not. If a pulse does occur, the counter will again be incremented causing VREG1 200 to increase the VDDI voltage again. The measure cycle can continue until the VDDI value is increased to overcome the NBTI effects. The NBTICOUNT signal bus is also available for other circuitry on-chip or off-chip that may make use of it. The NBTICOUNT is a bi-directional digital bus. Directionality is determined by the CNTL1 control logic block.

Figure 3:
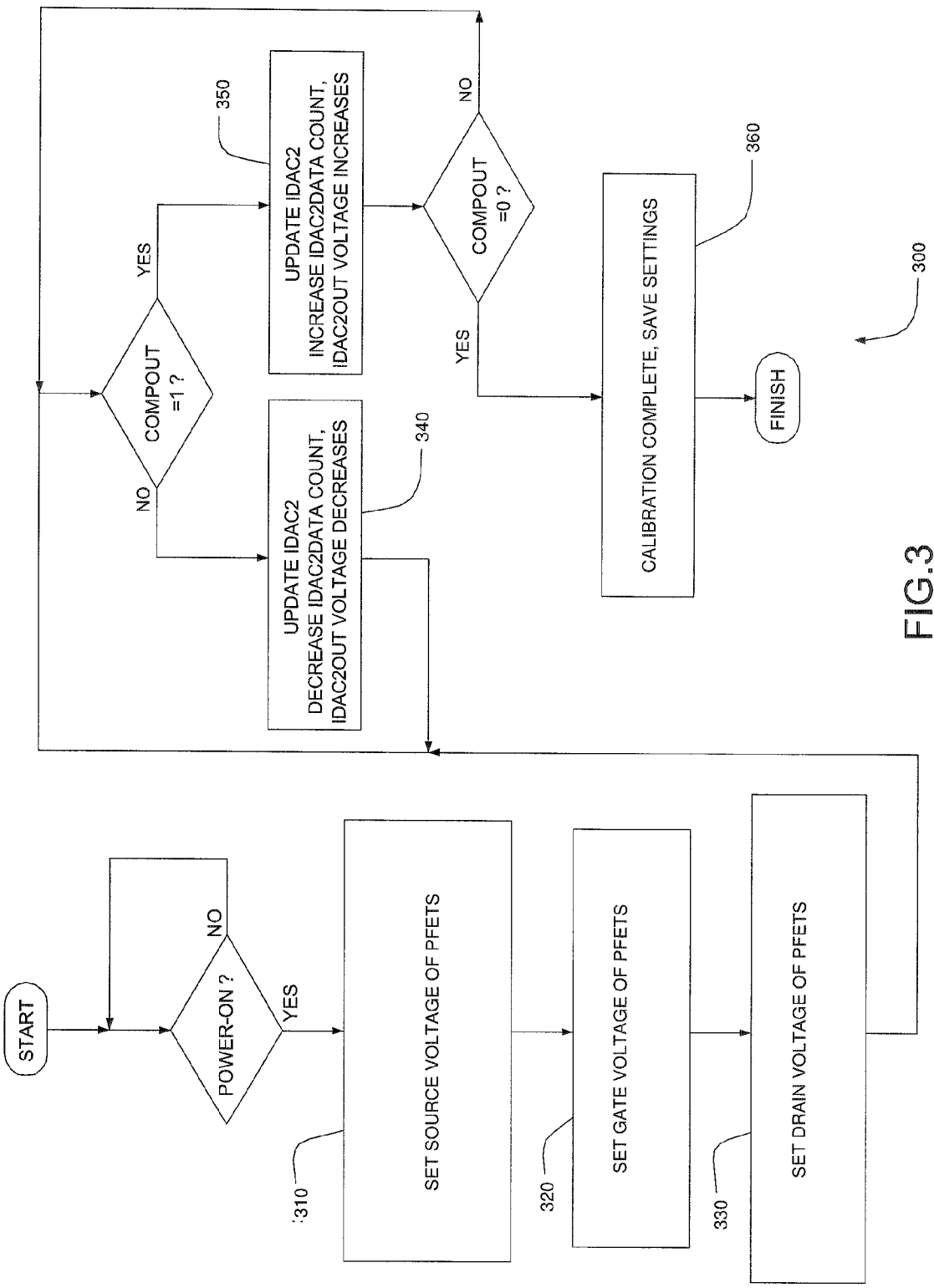
FIG. 3 is a flow diagram illustrating a calibration mode

FIG. 3 illustrates a flow diagram of calibration mode 300, which operates when the power is on. In step 310, method 300 sets the source voltage of reference device 420 and stress device 410 (PFETS). This includes configuring digital bi-directional NBTICOUNT bus to output and Vsource of reference device 420 equal to VDD. Setting the source voltage further includes setting NBTICOUNT, so that Vsource of stress device 410 equals the last VDDI value. Next, in steps 320 and 330, the gate and drain voltages of reference device 420 and stress device 410 are set, respectively. Step 320 includes configuring IDAC0 for the desired Iout and setting MUX1SEL and MUX23SEL to 1. Step 330 includes configuring IDAC1 and IDAC2 to the same Iout. Reference device 420 and stress device 410 see the same R1 and R2 loads, respectively.

If COMPOUT does not equal 1, then the IDAC2DATA count is decreased in step 340. If COMPOUT does equal 1, then the IDAC2DATA count is increased in step 350). Following this, if COMPOUT does not equal 0, then calibration mode returns to determining whether COMPOUT equals 1. However, if COMPOUT does equal 0, then the calibration is complete and the settings are saved in step 360. Step 360 includes saving IDAC(2:0)DATA for IDAC(2:0) and saving NBTICOUNT.

Figure 4:
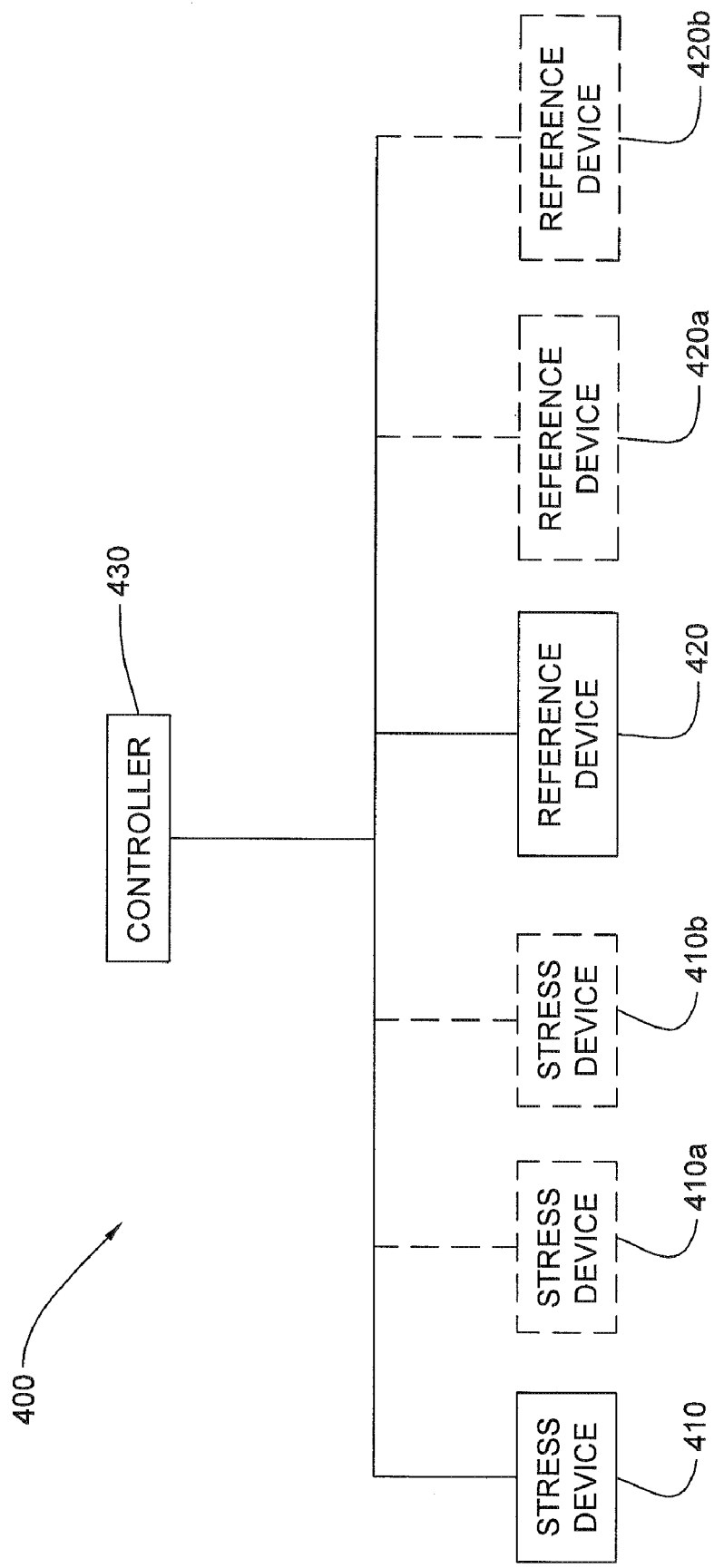
FIG. 4 is a diagram illustrating stress devices 410, 410a, 410b and reference devices 420, 420a, 420b connected to controller 430.

Accordingly, the embodiments of the invention provide an apparatus for and method of detection and compensation of NBTI induced threshold degradation. As illustrated in FIG. 4, a semiconductor device 400 is provided comprising stress devices 410, 410a, 410b and reference devices 420, 420a, 420b having a zero Vgs. A voltage source connected to a gate node of stress device 410 is provided. As described above, stress device 410 undergoes stress and reference device 420 does not. Controller 430 is connected to stress device 410 and reference device 420 to configure node voltages of stress device 410 and/or reference device 420 to reflect different regions of device operations found in digital and analog circuit applications. Moreover, controller 430 measures a difference in current between stress device 410 and reference device 420 to determine whether NBTI induced threshold degradation has occurred in stress device 410. As described above, VGATE2 and VGATE1 are under the control of DAC IDAC0 during measure mode.

Controller 430 also adjusts an output power supply voltage of stress device 410 until a performance of stress device 410 matches a performance of reference device 420 to account for the NBTI induced threshold degradation. As discussed above, if stress device 410 has undergone degradation, an increased VDDI value at its source node will act to compensate for the adverse effects. The measure cycle can continue until the VDDI value is increased to overcome the NBTI effects. Furthermore, controller 430 stimulates stress device 410 and/or reference device 420 with gate node signals and drain node bias voltages. As discussed above, the first time in measure mode, the DC bias voltages applied to the source and gate nodes of stress device 410 and reference device 420 as well as the load conditions at the drain nodes are intended to be identical.

R2 and a RL1 are provided to facilitate the development of the drain node bias voltages. As discussed above, IDAC2OUT and IDAC1OUT are developed from current flowing through R2 and a RL1, respectively. The load at the drain of reference device 420 is R1. The drain of stress device 410 is first connected to the output of a 2:1 analog multiplexer (AMUX3) having negligible on-resistance. Additionally, an analog multiplexer is connected to a drain node of stress device 410 such that R2 and/or RL1 are at a drain node of stress device 410 and/or reference device 420. As discussed above, VGATE2 and VGATE1 come from the 2:1 analog multiplexers AMUX2 and AMUX1, respectively, where the D0-to-Z path is enabled for both since the multiplexer select signals, MUX1SEL and MUX23SEL, are both at a logic zero. Moreover, the drains of reference device 420 and stress device 410 will see R2 since MUX23SEL is a logic one which enables the D1-to-Z path through the 2:1 analog multiplexer AMUX3.

Controller 430 can also generate an absolute current reference and/or an absolute voltage reference outside of an integrated circuit device that the semiconductor device is on. Controller 430 compares the absolute current reference and/or the absolute voltage reference to a current of stress device 410 to determine whether NBTI induced threshold degradation has occurred in stress device 410. As discussed above, this approach would allow Ids, and resulting voltage, from stress device 410 to be directly compared to an absolute current or voltage reference which could be calibrated external to the chip. Further, controller 430 forward biases a bulk node of stress device 410, including decreasing the magnitude of the Vt to account for the NBTI induced threshold degradation.

A method for accommodating for effects of NBTI over a lifetime of a semiconductor device is also provided. The method begins by configuring node voltages of at least one stress device 410 and/or at least one reference device 420 to reflect different regions of device operation found in digital and analog circuit applications, wherein stress device 410 comprises a voltage applied to its gate node, and wherein reference device 420 comprises a zero Vgs. As discussed above, during 'Stress Mode' an analog multiplexer allows the signal of interest to propagate to the gate node of stress device 410. This involves stimulating stress device 410 and/or reference device 420 with gate node signals and drain node bias voltages.

The method develops the drain node bias voltages using a R2 and/or a RL1. The method then connects an analog multiplexer to a drain node of stress device 410 such that R2 and/or a RL1 is at a drain node of stress device 410 and/or reference device 420. As discussed above, the multiplexer allows for the load at the drain of stress device 410 to be configurable resulting in either R2 or RL1. In stress mode, the D0-to-Z path through AMUX3 is enabled since MUX23SEL is a logic zero, which in turn switches in the replica load for the drain of stress device 410. The replica load can vary in its implementation, from an exact copy, or replica, of a circuit found elsewhere on the chip to R2.

Following this, the method performs a measure mode and an adjustment mode. The measure mode can measure a difference in current between stress device 410 and reference device 420 to determine whether NBTI induced threshold degradation has occurred in stress device 410. As discussed above, this is the setup where MUX23SEL is held at a constant logic one, but MUX1SEL gets toggled in a logic zero-one-zero pattern which constitutes one measure cycle. Several of these measure cycles can occur sequentially until the system responds and compensates for the NBTI degradation effects. The measure mode also can generate an absolute current reference and/or an absolute voltage reference outside of an integrated circuit device that the semiconductor device is on and compare the absolute current reference and/or the absolute voltage reference to a current of stress device 410 to determine whether the NBTI induced threshold degradation has occurred in stress device 410. As discussed above, this approach would allow Ids, and resulting voltage, from stress device 410 to be directly compared to an absolute current or voltage reference which could be calibrated external to the chip.

The adjustment mode can adjust an output power supply voltage of stress device 410 until a performance of stress device 410 matches a performance of reference device 420 to account for the NBTI induced threshold degradation. As discussed above, this involves the use of a comparator, a counter, a voltage regulator, and a control logic/state machine block. The adjustment mode also can forward bias a bulk node of stress device 410, including decreasing the magnitude of the Vt to account for the NBTI induced threshold degradation.

Figure 5A:
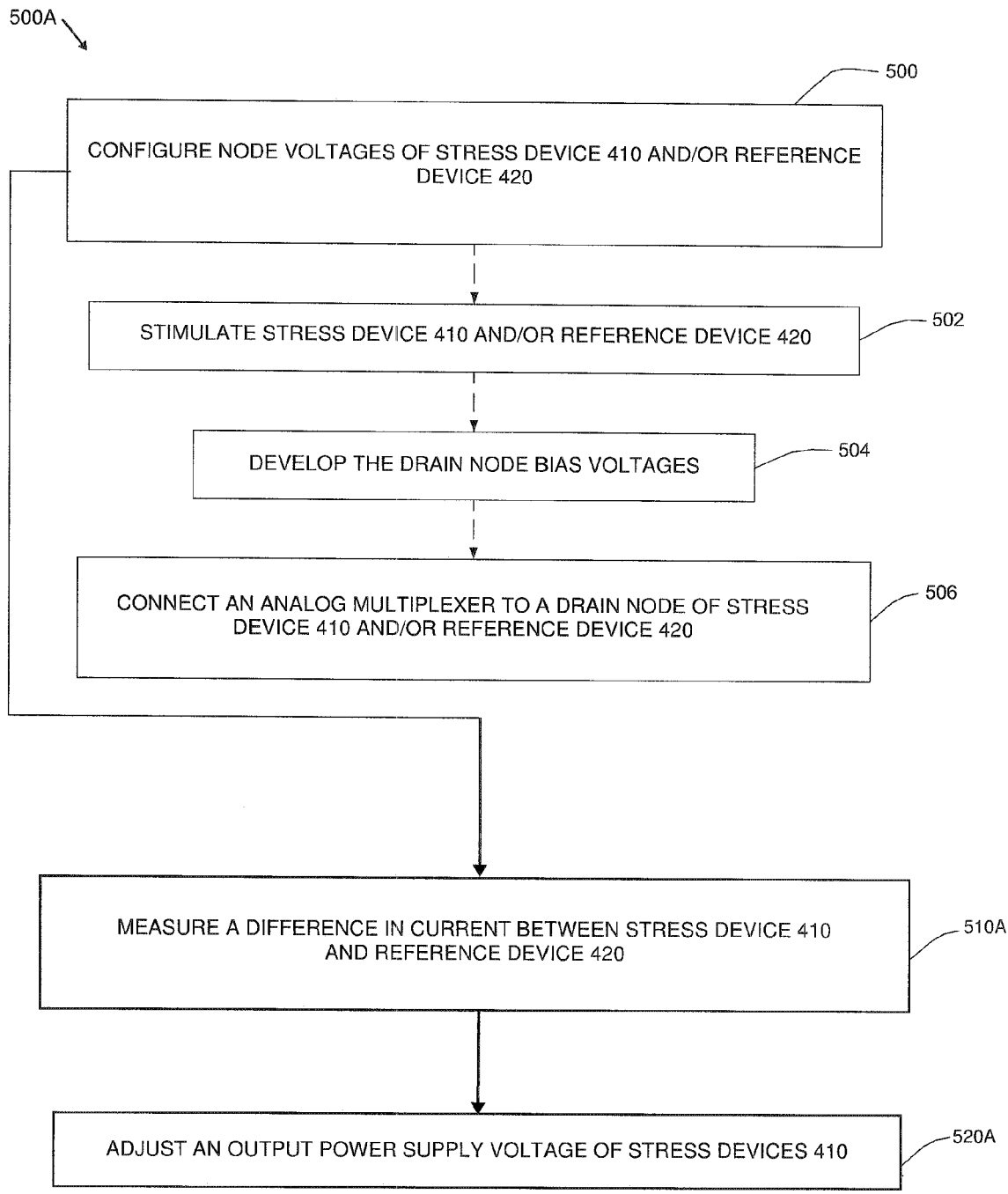
FIGS. 5A-5B are flow diagrams illustrating methods for detection and compensation of NBTI induced threshold degradation.
Figure 5B:
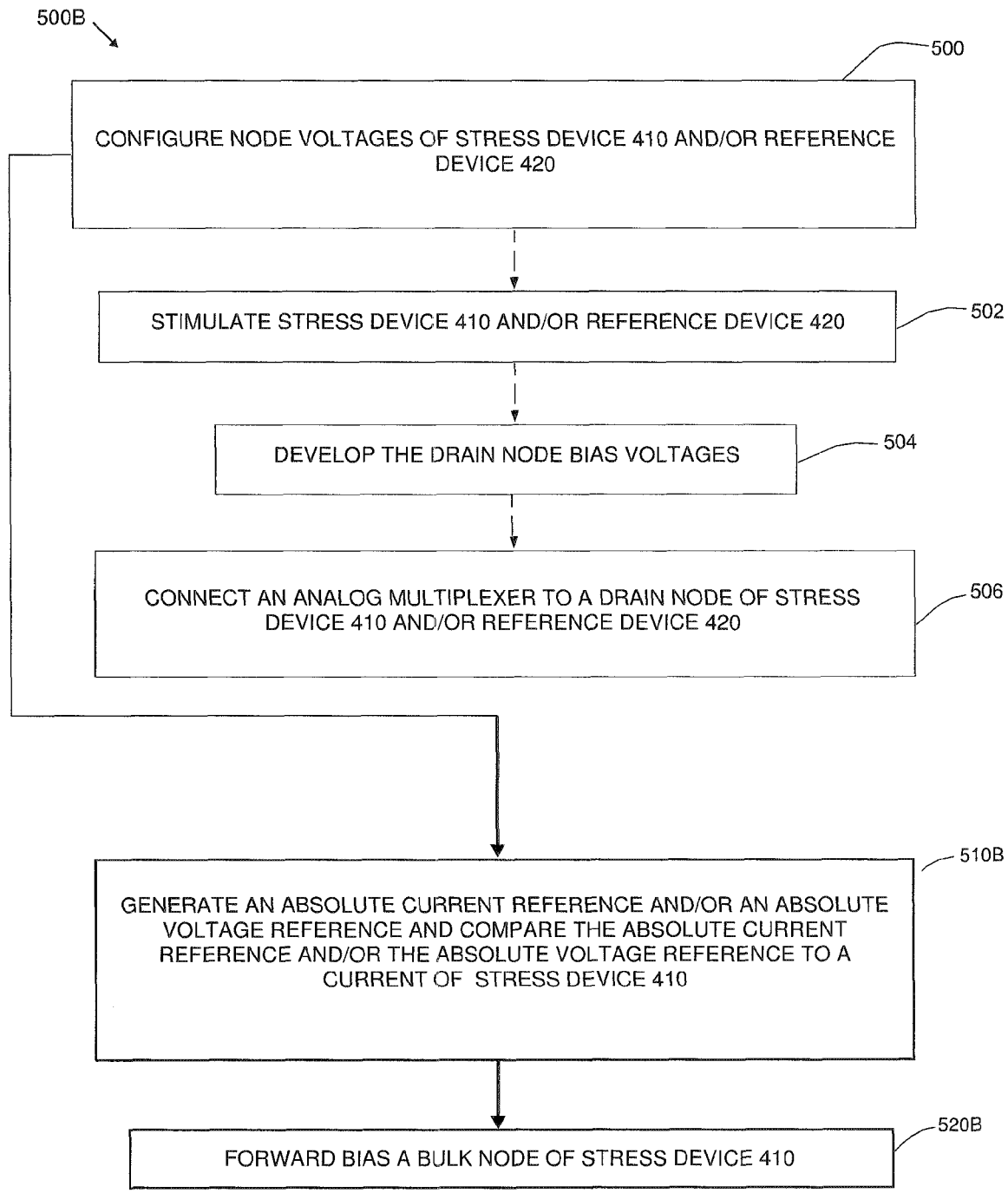

FIGS. 5A-5B are flow diagrams illustrating methods 500A and 500B, respectively, for detection and compensation of NBTI induced threshold degradation. Methods 500A and 500B each begin in step 502 by configuring node voltages of stress device 410 and/or reference device 420 to reflect different regions of device operations found in digital and analog circuit applications, wherein stress device 410 comprises a voltage applied to its gate node, and wherein reference device 420 comprises a zero Vgs. As described above, stress device 410 undergoes stress and reference device 420 does not.

This involves, in step 502, stimulating stress device 410 and/or reference device 420 with gate node signals and drain node bias voltages. In step 504, the drain node bias voltages are developed using R2 and/or RL1. As discussed above, IDAC2OUT and IDAC1OUT are developed from current flowing through RL1 and R2, respectively. The load at the drain of reference device 420 is R1. The drain of stress device 410 is first connected to the output of a 2:1 analog multiplexer (AMUX3) having negligible on-resistance. In step 506, an analog multiplexer is connected to a drain node of stress device 410 such that R2 and/or RL1 is at a drain node of stress device 410 and/or reference device 420. As discussed above, VGATE2 and VGATE1 come from the 2:1 analog multiplexers AMUX2 and AMUX1, respectively, where the D0-to-Z path is enabled for both since the multiplexer select signals, MUX1SEL and MUX23SEL, are both at a logic zero. The drains of reference device 420 and stress device 410 will see R2 since MUX23SEL is a logic one which enables the D1-to-Z path through the 2:1 analog multiplexer AMUX3.

Following this, a measure mode and an adjustment mode are performed. In method 500A, the difference in current between stress device 410 and reference device 420 is measured in step 510A to determine whether NBTI induced threshold degradation has occurred in stress device 410. As discussed above, this is the setup where MUX23SEL is held at a constant logic one, but MUX1SEL gets toggled in a logic zero-one-zero pattern which constitutes one measure cycle. Several of these measure cycles can occur sequentially until the system responds and compensates for the NBTI degradation effects.

In step 520A, the output power supply voltage of stress device 410 is adjusted until a performance of stress device 410 matches a performance of reference device 420 to account for the NBTI induced threshold degradation. As discussed above, this involves the use of a comparator, a counter, a voltage regulator, and a control logic/state machine block.

In method 500B, an absolute current reference and/or an absolute voltage reference is generated outside of an integrated circuit device that the semiconductor device is on and compared to a current of stress device 410 to determine whether the NBTI induced threshold degradation has occurred in stress device 410 (step 510B). As discussed above, this approach would allow Ids, and resulting voltage, from stress device 410 to be directly compared to an absolute current or voltage reference which could be calibrated external to the chip. In step 520B, the measure mode forward biases a bulk node of stress device 410, including decreasing the magnitude of the Vt to account for the NBTI induced threshold degradation.

Figure 6:
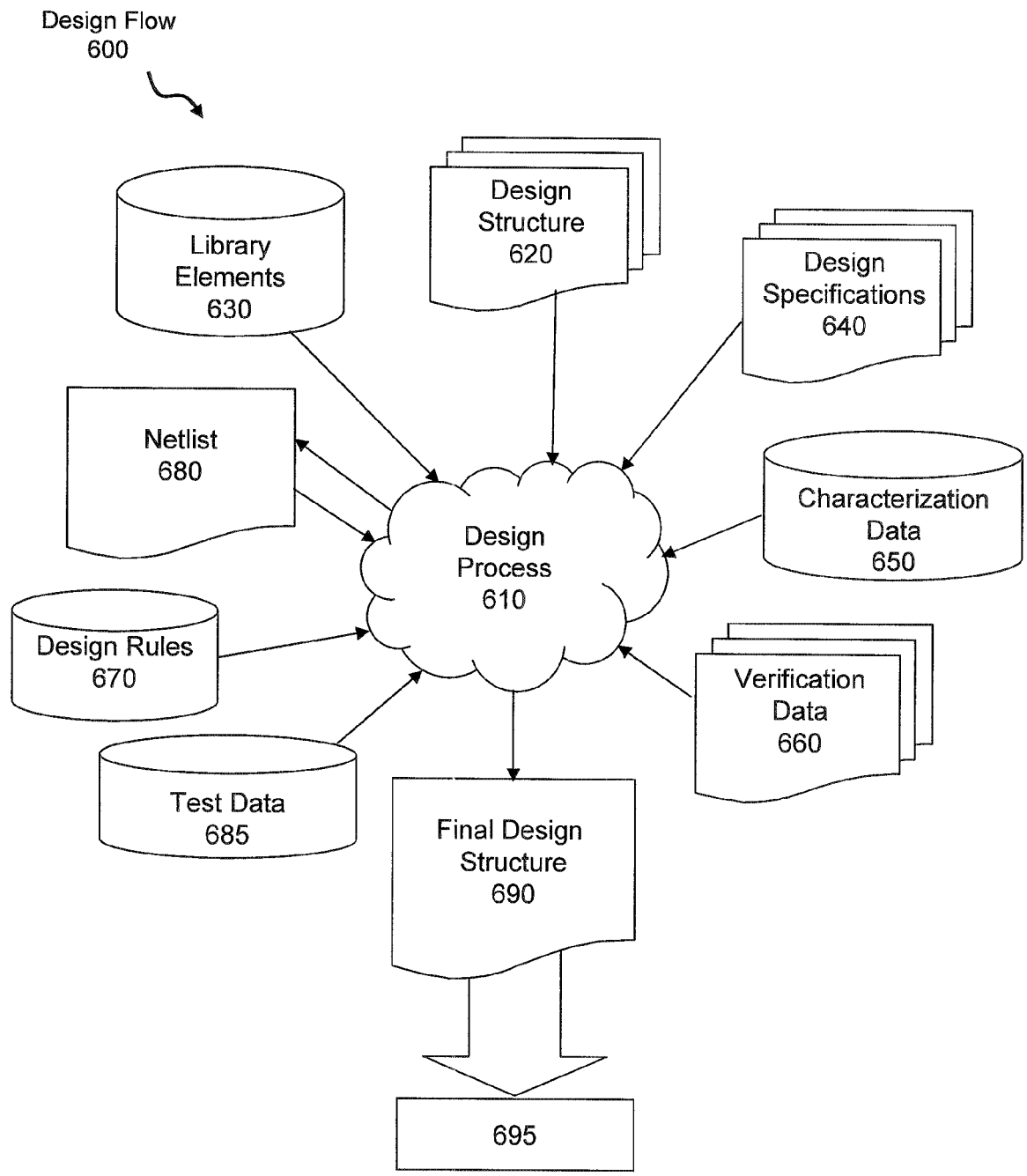
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises a circuit in FIGS. 1-4 in the form of schematics or HDL, a hardware-description language (e.g., Verilog, VHDL, C, etc.). Design structure 620 may be contained on one or more machine readable medium. For example, design structure 620 may be a text file or a graphical representation of a circuit in FIGS. 1-4. Design process 610 preferably synthesizes (or translates) a circuit in FIGS. 1-4 into a netlist 680, where netlist 680 is, for example, a list of wires, transistors, logic gates, control circuits, I/O, models, etc. that describes the connections to other elements and circuits in an integrated circuit design and recorded on at least one of machine readable medium. This may be an iterative process in which netlist 680 is resynthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 685 (which may include test patterns and other testing information). Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates an embodiment of the invention as shown in FIG. 6, along with any additional integrated circuit design or data (if applicable), into a second design structure 690. Design structure 690 resides on a storage medium in a data format used for the exchange of layout data of integrated circuits (e.g. information stored in a GDSII (GDS2), GL1, OASIS, or any other suitable format for storing such design structures). Design structure 690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 6. Design structure 690 may then proceed to a stage 695 where, for example, design structure 690: proceeds to tape-out, is released to manufacturing, is released to a mask house, is sent to another design house, is sent back to the customer, etc.

Accordingly, an aspect of the embodiments of the invention involves how to indirectly determine the effects of NBTI on Vt through direct monitoring of the difference in Ids of two identical PMOS transistors or two identical sets of PMOS transistors. Another aspect of the embodiments the invention is to have the system react to the NBTI induced Vt and Ids degradation by compensating for it through increasing the power supply voltage to the affected transistors.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

Therefore, while the embodiments of the invention have been described in terms of preferred embodiments, those skilled in the art will recognize that the embodiments of the invention can be practiced with modification within the spirit and scope of the appended claims.

What is claimed is:

1. A design structure embodied in a non-transitory machine readable medium used in a design process, the design structure comprising a semiconductor device, comprising:
   at least one stress device;
   a voltage source connected to a gate node of said at least one stress device;
   at least one reference device comprising a zero gate-to-source voltage; and
   a controller connected to said stress device and to said reference device, wherein said controller is adapted to:
      configure node voltages of at least one of said at least one stress device and said at least one reference device to reflect different regions of device operations;
      measure a difference in current between said at least one stress device and said at least one reference device to determine whether negative bias temperature instability (NBTI) induced threshold degradation has occurred in said at least one stress device; and
      adjust an output power supply voltage of said at least one stress device to account for said NBTI induced threshold degradation.

2. The design structure according to claim 1, wherein said design structure comprises a netlist which describes a circuit.

3. The design structure according to claim 1, wherein said design structure resides on a storage medium as a data format used for the exchange of layout data of integrated circuits.

4. The design structure according to claim 1, wherein said design structure includes at least one of test data files, characterization data, verification data, and design specifications.

5. The design structure according to claim 1, wherein said controller is further adapted to stimulate said at least one of said at least one stress device and said at least one reference device with gate node signals and drain node bias voltages.

6. The design structure according to claim 5, further comprising an analog multiplexer connected to a drain node of said at least one of said at least one stress device.

7. The design structure according to claim 1, wherein said controller is further adapted to adjust said output power supply voltage of said at least one stress device until a performance of said at least one stress device matches a performance of said at least one reference device.

8. A design structure embodied in a non-transitory machine readable medium used in a design process, the design structure comprising a semiconductor device, comprising:
   at least one stress device; a voltage source connected to a gate node of said at least one stress device;
   at least one reference device comprising a zero gate-to-source voltage; and
   a controller connected to said stress device and to said reference device, wherein said controller is adapted to:
   configure node voltages of at least one of said at least one stress device and said at least one reference device to reflect different regions of device operations;
   measure a difference in current between said at least one stress device and said at least one reference device to determine whether negative bias temperature instability (NBTI) induced threshold degradation has occurred in said at least one stress device; and
   adjust an output power supply voltage of said at least one stress device until a performance of said at least one stress device matches a performance of said at least one reference device to account for said NBTI induced threshold degradation.

9. The design structure according to claim 8, wherein said design structure comprises a netlist which describes a circuit.

10. The design structure according to claim 8, wherein said design structure resides on a storage medium as a data format used for the exchange of layout data of integrated circuits.

11. The design structure according to claim 8, wherein said design structure includes at least one of test data files, characterization data, verification data, and design specifications.

12. The design structure according to claim 8, wherein said controller is further adapted to stimulate said at least one of said at least one stress device and said at least one reference device with gate node signals and drain node bias voltages.

13. The design structure according to claim 12, further comprising an analog multiplexer connected to a drain node of said at least one of said at least one stress device.

* * * * *